(12) United States Patent
Shu

(10) Patent No.: US 7,039,382 B2
(45) Date of Patent: May 2, 2006

(54) DC OFFSET CALIBRATION FOR A RADIO TRANSCEIVER MIXER

(75) Inventor: Tzi-Hsiung Shu, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 531 days.

(21) Appl. No.: 09/858,812

(22) Filed: May 15, 2001

(65) Prior Publication Data

US 2002/0173288 A1 Nov. 21, 2002

(51) Int. Cl.
*H04B 1/10* (2006.01)
*H04B 1/18* (2006.01)

(52) U.S. Cl. .................. 455/313; 455/285; 455/302; 455/326

(58) Field of Classification Search .......... 455/283, 455/284, 285, 295, 296, 304, 305, 326, 323, 455/302, 293, 313, 318; 375/330, 349; 327/357, 327/358, 359, 238, 243, 246, 254, 255
See application file for complete search history.

(56) References Cited

U.S. PATENT DOCUMENTS

| | | | |
|---|---|---|---|
| 5,712,637 A | | 1/1998 | Lindquist et al. |
| 5,901,349 A | * | 5/1999 | Guegnaud et al. .......... 455/302 |
| 6,006,079 A | | 12/1999 | Jaffee et al. |
| 6,226,509 B1 | * | 5/2001 | Mole et al. ................. 455/302 |
| 6,321,076 B1 | * | 11/2001 | Jianqin ....................... 455/323 |
| 6,324,388 B1 | * | 11/2001 | Souetinov ................... 455/302 |
| 6,377,315 B1 | * | 4/2002 | Carr et al. ................... 348/726 |
| 6,429,733 B1 | * | 8/2002 | Pagliolo et al. ............. 327/552 |
| 6,529,719 B1 | * | 3/2003 | Imbornone et al. ......... 455/302 |
| 6,636,730 B1 | * | 10/2003 | Spargo et al. .............. 455/302 |
| 6,687,494 B1 | * | 2/2004 | Mourant ...................... 455/326 |
| 6,704,558 B1 | * | 3/2004 | Sorrells et al. ............. 455/323 |
| 6,738,601 B1 | * | 5/2004 | Rofougaran et al. ....... 455/66.1 |

OTHER PUBLICATIONS

Jan Crols, Student Member, IEEE and Michel S.J. Steyaert, Senior Member, IEEE, "A 1.5 GHz Highly Linear CMOS Downconversion Mixer," IEEE Journal of Solid-State Circuits, vol. 30, No. 2, Jul. 1995, pp. 736-742.

Hooman Darabi and Asad A. Abidi, Fellow, IEEE, "A 4.5-mW 900-MHz CMOS Receiver for Wireless Paging," IEEE Journal of Solid-State Circuits, vol. 35, No. Aug. 2000, pp. 1085-1096.

(Continued)

*Primary Examiner*—Simon Nguyen
(74) *Attorney, Agent, or Firm*—Sterne, Kessler, Goldstein & Fox PLLC

(57) ABSTRACT

A mixer for a radio transceiver includes a commutating mixer switch having a first differential input port coupled to a DC offset cancellation path. The first differential input port of the mixer switch includes a first terminal coupled to a first end of a first resistor and a second terminal coupled to a first end of a second resistor. Second ends of the first and second resistors are configured to receive a differential input signal. The DC offset cancellation path may provide a resistively coupled DC calibration signal for reducing the magnitude of DC offsets that may be present at the input of the mixer switch. The concept can be used for either image or non-image reject mixers.

30 Claims, 3 Drawing Sheets

OTHER PUBLICATIONS

Paolo Orsatti, Member, IEEE, Francesco Piazza, Associate Member, IEEE and Quitting Huang, Seinor Member, IEE, "A 20-mA-Receive, 55-mA-Transmit, Single-Chip GSM Transceiver in 0.25-μm CMOS," IEEE Journal of Solid-State Circuits, vol. 34, No. 12, Dec. 1999, pp. 1869-1880.

Aarno Parssinen, Student Member, IEEE, Jarkko Jussila, Student Member, IEEE, Jussi Ryynanen, Student Member, IEEE, Lauri Sumanen, Student Member, IEEE, and Kari A.I. Halonen, A 2-GHz Wide-Band Direct Conversion Receiver for WCDMA Applications, IEEE Journal of Solid-State Circuits, vol. 34, No. 12 Dec. 1999, pp. 1893-1903.

Behzad Razavi, "a 2.4-ghZ cmos Receiver for IEEE 802.11 Wireless LNA's," IEEE Journal of Solid-State Circuits, vol. 34, No. 10, Oct. 1999, pp. 1382-1385.

Joo Leong (Julian) Tham, Member, IEEE, Mihai A. Margarit, Bernd Pregardier, Member, IEEE, Christopher D. Hull, Rahul Magoon, Member, IEEE, and Frank Carr, "A 2.7-V 900-MHz/1.9-GHz Dual-Band Transceiver IC for Digital Wireless Communication," IEEE Journal of Solid-State Circuits, vol. 34, No. 3, Mar. 1999, pp. 286-291.

\* cited by examiner

DC OFFSET CALIBRATION FOR A RADIO TRANSCEIVER MIXER

BACKGROUND OF THE INVENTION

This invention relates in general to radio frequency (RF) transceivers and more particularly to mixers used in RF transceivers that provide DC offset calibration.

An RF transceiver (transmitter/receiver) typically requires a frequency translation function, in which a signal is translated from one carrier frequency, $\omega_1$, to another frequency, $\omega_2$. The translation is carried out by what is known as a "mixer." In effect, a mixer translates the center frequency, $\omega_1$, of a signal band, to a center frequency, $\omega_2$, by mixing the signal band with a local oscillator signal having a frequency of $\omega_{LO}$, where $\omega_{LO}=(\omega_1-\omega_2)$. The mixing operation yields a first band centered around $\omega_2$ and a second band centered around $2\omega_1-\omega_2$. An appropriate filter is then typically employed to select the desired signal band centered around $\omega_2$. When $\omega_1>\omega_2$, this operation is known in the art as downconversion mixing. On the other hand, when $\omega_1<\omega_2$, the operation is known as upconversion mixing.

Crols and M. S. J. Steyaert, "A 1.5 GHz Highly Linear CMOS Downconversion Mixer", *IEEE J. Solid-State Circuits*, vol. 30, pp. 736–742, July 1995 disclose a mixer design in which MOS transistors, operating in their linear region, are used as voltage-dependent resistors to modulate a signal. The impedance of the transistors in the linear region is controlled by the input signal to be modulated. Local oscillator signals are provided to the source/drain side of the transistors. There are certain weaknesses with this design, however. First, the linearity of the mixer is limited in that the impedance of the MOS transistors in the linear region become non-linear when the gate control voltage varies considerably. Second, the gain of the mixer is not well controlled, since it is difficult to match the impedance of the MOS transistors in the linear region to that of the resistor in the feedback loop of the amplifier. Finally, even if additional sets of MOS transistors are included for the DC offset cancellation path, mismatch of the transistors can be of a concern, especially if different signal path gains are to be implemented.

A typical transceiver is subject to other known non-idealities, which can yield an undesirable output. One such non-ideality relates to a direct current (DC) component, which is often introduced into the input signal of an upconversion mixer. If the desired input signal is centered around DC, the extra DC component introduced into the input signal will corrupt the signal and degrade the signal quality. The DC component, after mixing with the local oscillator (LO), generates an undesired tone at $\omega_{LO}$ at the output of the mixer.

Another example of non-ideality relates to LO feedthrough and self-mixing in a downcoversion mixer, in which the LO signal is coupled into the input signal and subsequently is mixed with the LO itself in the mixer, producing an undesirable DC component.

SUMMARY OF THE INVENTION

The present invention pertains to a mixer design for radio transceivers, which includes a calibration scheme for reducing DC offsets caused by various non-ideal effects in the transceiver.

In a first aspect of the present invention a mixer for a radio transceiver comprises a commutating mixer switch having a first differential input port. The first differential input port includes a first terminal coupled to a first end of a first resistor and a second terminal coupled to a first end of a second resistor. Second ends of the first and second resistors are configured to receive a differential input signal. According to this aspect of the invention, a DC offset cancellation path may further comprise a third resistor having a first end coupled to the first terminal of the first differential input port, and a fourth resistor having a first end coupled to the second terminal of the first differential input port, such that second ends of the third and fourth resistors are configured to receive a DC calibration signal.

In a second aspect of the invention, an image-reject mixer comprises a first commutating mixer switch having a first differential input port, a second differential input port for accepting a first local oscillator signal and a differential output port. A first resistor has a first end coupled to one of the terminals of the first differential input port of the first commutating mixer switch and has a second end. A second resistor having substantially the same resistance value as the first resistor has a first terminal coupled to the other terminal of the first differential input port and has a second end. A second commutating mixer switch has a first differential input port, a second differential input port for accepting a second local oscillator signal that is ninety degrees out of phase with the first oscillator signal and a differential output port. A third resistor having substantially the same resistance value as the first resistor has a first end coupled to one of the terminals of the first differential input port of the second commutating mixer switch and has a second end. A fourth resistor having substantially the same resistance value as the first resistor has a first end coupled to the other terminal of the first differential input port of the second commutating mixer switch and a second end. The second ends of the first and second resistors are configured to receive a first differential input signal, the second ends of the third and fourth resistors are configured to receive a second differential input signal that is ninety degrees out of phase with the first differential input signal, and the differential output port of the first commutating mixer switch is coupled to the differential output port of the second commutating mixer switch.

In a third aspect of the present invention, an image-reject mixer comprises an in-phase commutating mixer switch, which receives a first resistively coupled differential input signal, and a quadrature phase commutating mixer switch, which receives a second resistively coupled differential input signal. The in-phase commutating mixer switch modulates the first resistively coupled input signal with a first local oscillator signal and the quadrature phase commutating mixer modulates the second resistively coupled input signal with a second local oscillator signal, which is ninety degrees out of phase with the first local oscillator signal. The in-phase commutating mixer switch has a differential output, which is coupled to a differential output of the quadrature commutating mixer switch.

A further understanding of the nature and advantages of the inventions herein may be realized by reference to the remaining portions of the specification and the attached drawings.

DESCRIPTION OF THE SPECIFIC EMBODIMENTS

Figure 1:
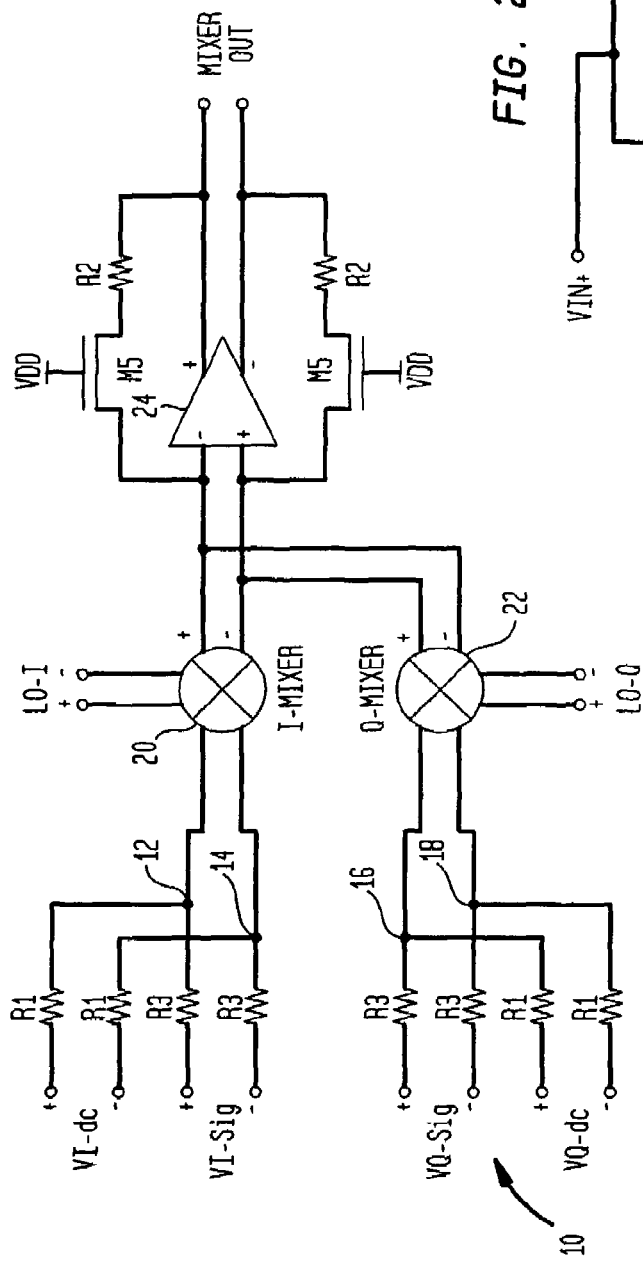
FIG. 1 shows an exemplary image reject mixer, according to an embodiment of the present invention.
Figure 2:
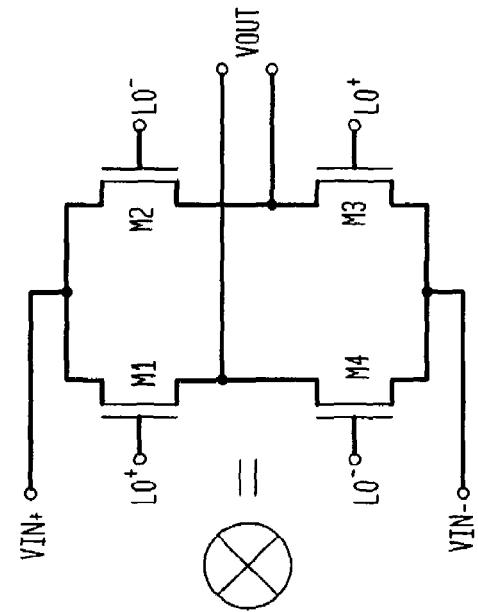
FIG. 2 shows a commutating mixer switch, which can be used for each of the in-phase and quadrature phase commutating mixer switches in the image-reject mixer shown in FIG. 1.

Referring to FIG. 1, there is shown an exemplary embodiment of an image reject mixer 10 according to an embodiment of the present invention. Resistors R1 (each R1 has the same resistance value) are configured to receive differential offset compensation signals, VI-dc and VQ-dc, and resistors R3 (each R3 has the same resistance value) are configured to receive main signals, VI-sig and VQ-sig, where "I" and "Q" indicate an in-phase channel and an quadrature phase channel, respectively. Unlike the prior art, with the use of the resistors, rather than reliance upon the on resistance of MOS transistors, the linearity of image-reject mixer 10 is superior. Resistors R3 function to convert the signals VI-sig and VQ-sig into currents, and resistors R1 function to convert VI-dc and VQ-dc inot currents, which are summed at nodes 12, 14, 16 and 18. Resistors R1 are selected to provide a DC offset cancellation path. An in-phase commutating mixer switch 20 is configured to receive the differential current signal from nodes 12 and 14, which are then modulated by an in-phase local oscillator signal, LO-I. Similarly, a quadrature phase commutating mixer switch 22 is configured to receive the differential current signal from nodes 16 and 18, which are then modulated by a quadrature phase (i.e. 90 degrees out-of-phase) local oscillator signal, LO-Q. An exemplary embodiment of a commutating mixer switch, which can be used for each of the in-phase 20 and quadrature phase 22 commutating mixer switches, is shown in FIG. 2.

As shown in FIG. 1, the differential outputs of in-phase 20 and quadrature phase 22 commutating mixer switches are connected together and input into an operational amplifier 24. The positive end of the differential output of operational amplifier 24 is fed back to the inverting input of operational amplifier 24 and the negative end of the differential output of operational amplifier 24 is fed back to the non-inverting input of operational amplifier 24.

Each of the feedback loops of operational amplifier 24 contains a resistor R2 (each R2 has the same resistance value) and a MOS transistor M5 (each M5 has substantially the same physical and electrical characteristics). The gates of both MOS transistors M5 are coupled to a power supply, VDD, so that they remain on and present themselves as resistive components. Also, the physical and material characteristics of both MOS transistors M5 may be selected so that they provide an impedance match with the MOS transistors of commutating mixer switches 20 and 22 (e.g. MOS transistors M1–M4 of the commutating mixer switch in FIG. 2). Resistors R2 in combination with resistors R3 control the gain of the amplifier. Finally, an optional capacitor may be placed in parallel with each of the feedback loops containing the series combination of MOS transistor M5 and resistor R2 to form a first-order low-pass filter.

Figure 3A:
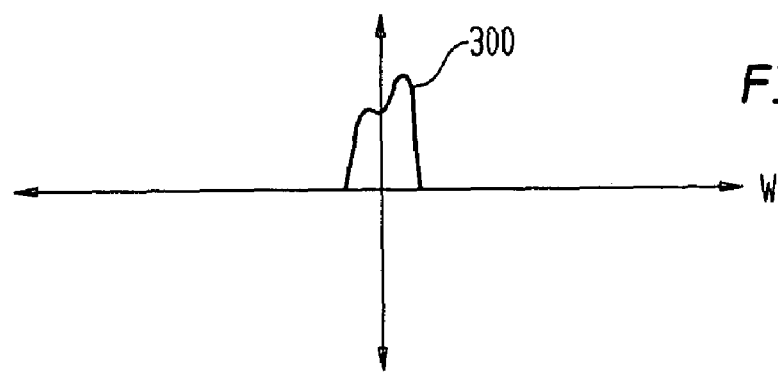
FIG. 3A shows the frequency spectrum of a baseband signal, which may be input into the exemplary image reject mixer shown in FIG. 1.
Figure 3B:
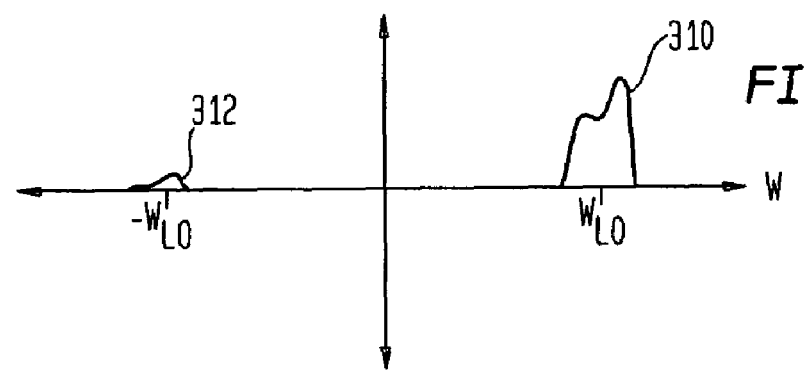
FIG. 3B shows the frequency spectra of the output of the exemplary image reject mixer shown in FIG. 1, including a desired mixer output signal and a rejected image signal.

Referring now to FIG. 3A there is shown an illustration of a signal band spectrum 300, which may, for example, be mixed with (i.e. modulated by) the local oscillator signal, LO in the image reject mixer 10 in FIG. 1. FIG. 3B shows the output of the mixer, including a desired mixer output signal 310 and the rejected image signal 312, which may be present due to non-perfect image rejection.

Figure 4A:
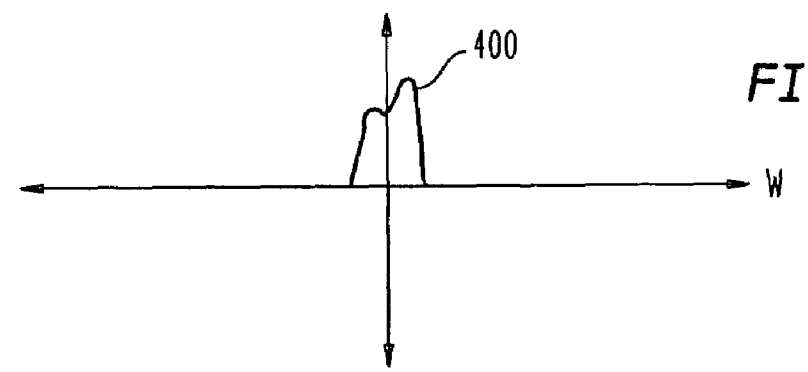
FIG. 4A shows the frequency spectrum of a baseband signal, which may be input into a modified version of the exemplary image reject mixer shown in FIG. 1.
Figure 4B:
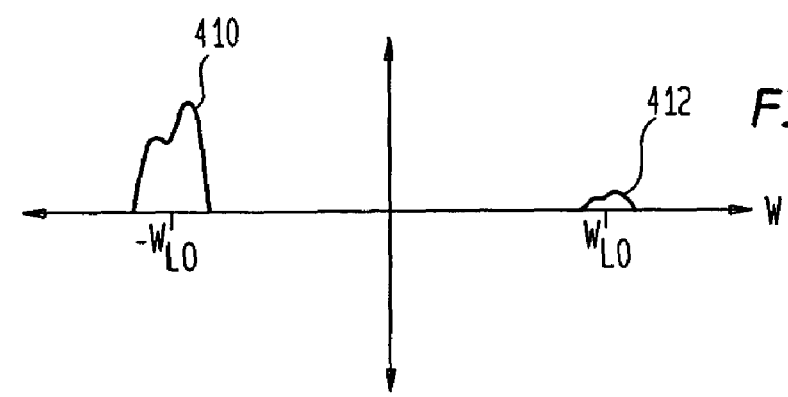
FIG. 4B shows the frequency spectra of the output of a modified version of the exemplary image reject mixer shown in FIG. 1, including a desired mixer output signal and a rejected image signal.

FIGS. 4A and 4B are similar to FIGS. 3A and 3B but correspond to a modified version (i.e. alternative embodiment) of the image reject mixer in FIG. 1, where the coupling of the differential output of quadrature phase commutating mixer switch 22 to the differential output of in-phase commutating mixer switch 20 is reversed such that the positive terminal of the differential output of quadrature phase commutating mixer switch 22 is coupled to the positive terminal of the differential output of in-phase commutating mixer switch 20 and the negative terminal of the differential output of quadrature phase commutating mixer switch 22 is coupled to the negative terminal of the differential output of in-phase commutating mixer switch 20. FIG. 4A shows a diagrammatic illustration of a signal band spectrum 400, which may, for example, be mixed with (i.e. modulated by) the local oscillator signal of the modified version of the image reject mixer in FIG. 1. FIG. 3B shows the output of the modified version of the image reject mixer in FIG. 1, including a desired mixer output signal 410 and the rejected image signal 412, which may be present due to non-perfect image rejection.

Figure 5:
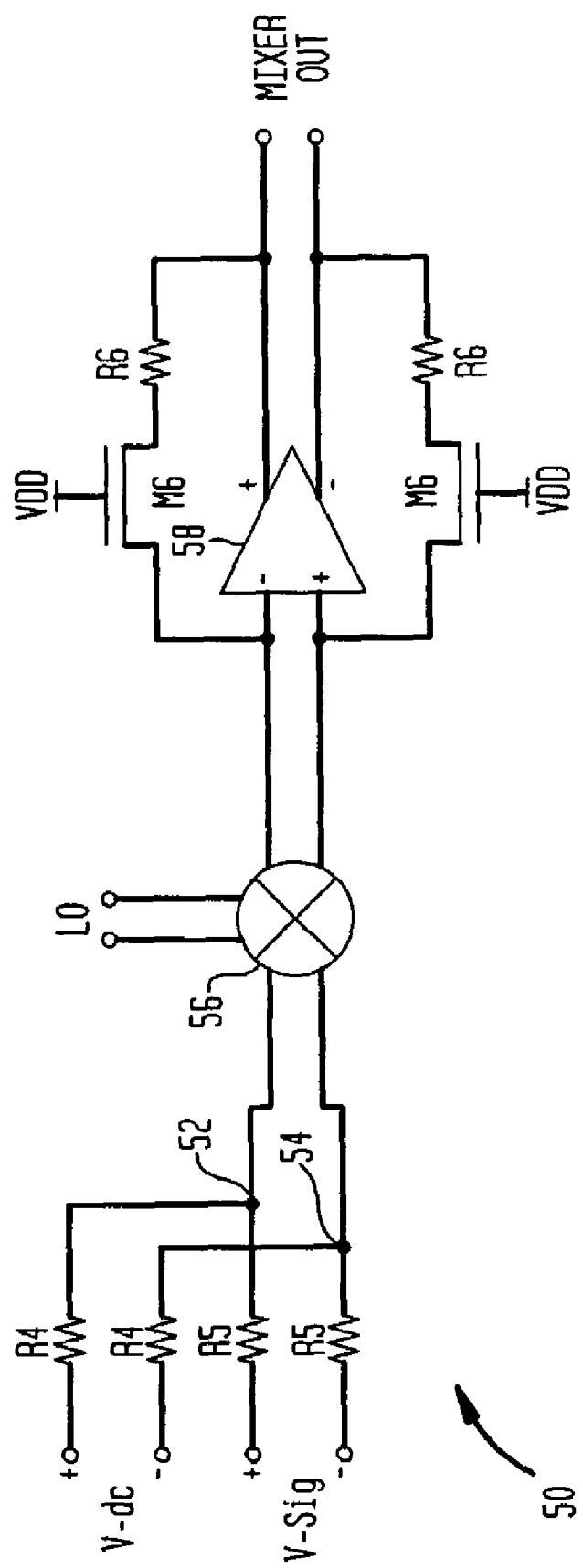
FIG. 5 shows an exemplary non-image reject mixer, according to an embodiment of the present invention.

The mixer in FIG. 1 is an image reject mixer. However, the present invention is not limited to image reject mixers. Indeed, the inventors of the present invention have contemplated that the DC offset calibration aspect of the present invention may apply to other non-image reject mixers just as well. Accordingly, FIG. 5 shows an exemplary non-image reject mixer 50 having DC offset calibration, according to another embodiment of the present invention. Resistors R4 (each R4 has the same resistance value) are configured to receive a differential offset compensation signal, V-dc, and resistors R5 (each R5 has the same resistance value) are configured to receive a main signal, V-sig. Unlike the prior art, with the use of the resistors, rather than reliance upon the on resistance of MOS transistors, the linearity of mixer 50 is superior. Resistors R5 function to convert main signal, V-sig, into currents, which are summed at nodes 52 and 54. Resistors R4 are selected to provide a DC offset cancellation path. A commutating mixer switch 56 is configured to receive the differential current signal from nodes 52 and 54, which is then modulated by a local oscillator signal, LO. An exemplary embodiment of a commutating mixer switch, which can be used for commutating mixer switch 56, is shown in FIG. 2. The differential output of commutating mixer switch 56 is coupled to the differential input of an operational amplifier 58. The positive end of the differential output of operational amplifier 58 is fed back to the inverting input of operational amplifier 58 and the negative end of the differential output of operational amplifier 58 is fed back to the non-inverting input of operational amplifier 58. Each of the feedback loops of operational amplifier 58 contains a resistor R6 (each R6 has the same resistance value) and a MOS transistor M6 (each M6 has substantially the same physical and electrical characteristics). The gates of both MOS transistors M6 are coupled to a power supply, VDD, so that they remain on and present themselves as resistive components. Also, the physical and material characteristics of both MOS transistors M6 may be selected so that they provide an impedance match with the MOS transistors of the commutating mixer switch 56 (e.g. MOS transistors M1–4 of the commutating mixer switch in FIG. 2). Resistors R6 in combination with resistors R5 control the gain of the amplifier. Finally, an optional capacitor may be placed in parallel with each of the feedback loops containing the series combination of MOS transistor M6 and resistor R6 to form a first-order low-pass filter.

As explained above, another non-ideality that may be present in radio transceivers, and which can produce an undesirable DC component, is LO self mixing. According to another aspect of the present invention, therefore, a mixer having DC offset calibration for compensating for a DC component attributable to LO self mixing is provided. Both FIG. 1 and FIG. 5 may be modified to provide exemplary circuits capable of providing compensation for LO self mixing.

For example, the modification of FIG. 1 would entail substituting VI-dc with VI-LO and VQ-dc with VQ-LO, where VI-LO and VQ-LO are derived from the local oscillator signals, LO-I and LO-Q, respectively. To determine the DC components attributable to LO self mixing, each of the differential inputs can shorted and the output of the mixer measured, with LO-I and LO-Q alternately applied to the commutating mixer switch 66. Information provided by this measurement can be used to set the amplitude and/or phase of VI-LO and/or VQ-LO to compensate for any DC component added to the output due to LO self mixing.

Modification of the non-image reject mixer shown in FIG. 5 would be similar. In this case, V-dc would be replaced with V-LO. To determine the DC component attributable to LO self mixing, each of the differential inputs V-LO and V-sig are shorted and the output of the mixer is measured with the LO applied to the commutating mixer switch. Information provided by this measurement can then be used to set the amplitude and/or phase of V-LO, to compensate for any DC component added to the output because of LO self mixing.

Although the invention has been described in terms of a preferred methods and structure, it will be obvious to those skilled in the art that many modifications and alterations may be made to the disclosed embodiments without departing from the invention. For example, a pmos transistor may be substituted for any of the nmos transistors used in the embodiments shown in the figures with only minor modifications required to the biasing scheme. Accordingly, these and other modifications and alterations are intended to be considered as within the spirit and scope of the invention as defined by the appended claims.

What is claimed is:

1. An image-reject mixer, comprising:
   a first commutating mixer switch having a first input port configured to accept a first resistively coupled differential input signal, a second input port configured to accept a first local oscillator signal and an output port having a positive terminal and a negative terminal; and
   a second commutating mixer switch having a first input port configured to accept a second resistively coupled differential input signal that is ninety degrees out of phase with the first differential input signal, a second input port configured to accept a second oscillator signal that is approximately ninety degree out of phase with the first oscillator signal and an output port having a positive terminal coupled to the negative terminal of the output port of the first commutating mixer switch and a negative terminal coupled to the positive terminal of the output port of the first commutating mixer to provide a combined differential output signal.

2. The image-reject mixer of claim 1, further comprising:
   a differential amplifier having a differential input including a non-inverting input terminal coupled to the negative terminal of the output port of the first commutating mixer, an inverting input terminal coupled to the positive terminal of the output port of the first commutating mixer and a differential output.

3. The image-reject mixer of claim 2, wherein the differential amplifier further comprises:
   a first feedback loop connected between a first terminal of the differential output of the amplifier to the non-inverting input terminal of the amplifier; and
   a second feedback loop connected between the other terminal of the differential output of the amplifier to the inverting input terminal of the amplifier.

4. The image-reject mixer of claim 3, wherein the first feedback loop comprises a first MOS transistor having a gate coupled to a power supply, a source coupled to the first terminal of the differential output and a drain coupled to the non-inverting input of the amplifier and wherein the second feedback loop comprises a second MOS transistor having a gate coupled to the power supply, a source coupled to the other terminal of the differential output and a drain coupled to the inverting input terminal of the amplifier, the first and second MOS transistors operable to provide an impedance match to the first and second commutating mixer switches.

5. The image-reject mixer of claim 4, wherein the first feedback loop further comprises a first resistor coupled between the source of the first MOS transistor and the first terminal of the differential output and the second feedback loop further comprises a second resistor having a resistance substantially equal to a resistance of the first resistor, the second resistor coupled between the source of the second MOS transistor and the other differential output.

6. An image-reject mixer, comprising:
   a first commutating mixer switch having a first differential input port, a second differential input port for accepting a first local oscillator signal and a differential output port;
   a first resistor having a first end coupled to one of the terminals of the first differential input port of the first commutating mixer switch and a second end;
   a second resistor having substantially the same resistance value as the first resistor, the second resistor having a first terminal coupled to the other terminal of the first differential input port and a second end;
   a second commutating mixer switch having a first differential input port, a second differential input port for accepting a second local oscillator signal that is ninety degrees out of phase with the first oscillator signal and a differential output port;
   a third resistor having substantially the same resistance value as the first resistor, the third resistor having a first end coupled to one of the terminals of the first differential input port of the second commutating mixer switch and a second end; and
   fourth resistor having substantially the same resistance value as the first resistor, the fourth resistor having a first end coupled to the other terminal of the first differential input port of the second commutating mixer switch and a second end,
   wherein the second ends of the first and second resistors are configured to receive a first differential input signal, the second ends of the third and fourth resistors are configured to receive a second differential input signal that is ninety degrees out of phase with the first differential input signal, and the differential output port of the first commutating mixer switch is coupled to the differential output port of the second commutating mixer switch.

7. The image-reject mixer of claim 6, wherein the differential output port of the first commutating mixer switch comprises a positive terminal and a negative terminal and the differential output port of the second commutating mixer switch has a positive terminal coupled to the positive terminal of the first commutating mixer switch and a negative terminal coupled to the negative terminal of the first commutating mixer switch.

8. The image reject mixer of claim 7, further comprising:
a fifth resistor having a first end coupled to the first end of the first resistor and a second end;
a sixth resistor having substantially the same resistance value as the fifth resistor, the sixth resistor having a first end coupled to the first end of the second resistor and a second end;
a seventh resistor having substantially the same resistance value as the fifth resistor, the seventh resistor having a first end coupled to the first end of the third resistor and a second end; and
an eighth resistor having substantially the same resistance value as the fifth resistor, the eighth resistor having a first end coupled to the first end of the fourth resistor and a second end.

9. The image-reject mixer of claim 8, further comprising a differential amplifier having a differential input coupled to the differential output ports of the first and second commutating mixer switches and a differential output.

10. The image-reject mixer of claim 9, wherein the second ends of the fifth and sixth resistors are configured to receive a first DC calibration signal and the second ends of the seventh and eighth resistors are configured to receive a second DC calibration signal, the resistance value of each of the fifth through eighth resistors and the first and second DC calibration signals selected to compensate for DC offset voltages present at the differential input of the differential amplifier.

11. The image-reject mixer of claim 10, wherein the differential amplifier further comprises:
a first feedback loop connected between a first terminal of the differential output of the amplifier and one of the input terminals of the amplifier; and
a second feedback loop connected between the other terminal of the differential output of the amplifier and the other input terminal of the amplifier.

12. The image-reject mixer of claim 11, wherein the first feedback loop comprises a first MOS transistor having a gate coupled to a power supply, a source coupled to the first terminal of the differential output of the amplifier and a drain coupled to the one of the input terminals of the amplifier and wherein the second feedback loop comprises a second MOS transistor having a gate coupled to the power supply, a source coupled to the other terminal of the differential output of the amplifier and a drain coupled to the other input terminal of the amplifier, the first and second MOS transistors operable to provide an impedance match to the first and second commutating mixer switches.

13. The image-reject mixer of claim 12, wherein the first feedback loop further comprises a ninth resistor coupled between the source of the first MOS transistor and the first terminal of the differential output of the amplifier and the second feedback loop further comprises a tenth resistor having a resistance substantially equal to a resistance of the ninth resistor, the tenth resistor coupled between the source of the second MOS transistor and the other terminal of the differential output of the amplifier.

14. The image-reject mixer of claim 6, wherein the differential output port of the first commutating mixer switch comprises a positive terminal and a negative terminal and the differential output port of the second commutating mixer switch has a positive terminal coupled to the negative terminal of the first commutating mixer switch and a negative terminal coupled to the positive terminal of the first commutating mixer switch.

15. The image reject mixer of claim 14, further comprising:
a fifth resistor having a first end coupled to the first end of the first resistor and a second end;
a sixth resistor having substantially the same resistance value as the fifth resistor, the sixth resistor having a first end coupled to the first end of the second resistor and a second end;
a seventh resistor having substantially the same resistance value as the fifth resistor, the seventh resistor having a first end coupled to the first end of the third resistor and a second end; and
an eighth resistor having substantially the same resistance value as the fifth resistor, the eighth resistor having a first end coupled to the first end of the fourth resistor and a second end.

16. The image reject mixer of claim 15, further comprising a differential amplifier having a differential input coupled to the differential output ports of the first and second commutating mixer switches and a differential output.

17. The image-reject mixer of claim 16, wherein the second ends of the fifth and sixth resistors are configured to receive a first DC calibration signal and the second ends of the seventh and eighth resistors are configured to receive a second DC calibration signal, the resistance value of each of the fifth through eighth resistors and the first and second DC calibration signals selected to compensate for DC offset voltages present at the differential input of the differential amplifier.

18. The image-reject mixer of claim 17, wherein the differential amplifier further comprises:
a first feedback loop connected between a first terminal of the differential output of the amplifier and one of the input terminals of the amplifier; and
a second feedback loop connected between the other terminal of the differential output of the amplifier and the other input terminal of the amplifier.

19. The image-reject mixer of claim 18, wherein the first feedback loop comprises a first MOS transistor having a gate coupled to a power supply, a source coupled to the first terminal of the differential output of the amplifier and a drain coupled to the one of the input terminals of the amplifier and wherein the second feedback loop comprises a second MOS transistor having a gate coupled to the power supply, a source coupled to the other terminal of the differential output of the amplifier and a drain coupled to the other input terminal of the amplifier, the first and second MOS transistors operable to provide an impedance match to the first and second commutating mixer switches.

20. The image-reject mixer of claim 19, wherein the first feedback loop comprises a first MOS transistor having a gate coupled to a power supply, a source coupled to the first terminal of the differential output of the amplifier and a drain coupled to the one of the input terminals of the amplifier and wherein the second feedback loop comprises a second MOS transistor having a gate coupled to the power supply, a source coupled to the other terminal of the differential output of the amplifier and a drain coupled to the other input terminal of the amplifier, the first and second MOS transistors operable to provide an impedance match to the first and second commutating mixer switches.

21. The image-reject mixer of claim 20, wherein the first feedback loop further comprises a ninth resistor coupled between the source of the first MOS transistor and the first terminal of the differential output of the amplifier and the second feedback loop further comprises a tenth resistor having a resistance substantially equal to a resistance of the ninth resistor, the tenth resistor coupled between the source of the second MOS transistor and the other terminal of the differential output of the amplifier.

22. An image-reject mixer comprising:
a first commutating mixer switch having a first input port configured to accept a first resistively coupled differential input signal and a first resistively coupled DC calibration signal, a second input port configured to accept a first local oscillator signal, and an output port having a positive terminal and a negative terminal; and
a second commutating mixer switch having a first input port configured to accept a second resistively coupled differential input signal that is approximately ninety degrees out of phase with the first differential input signal and further configured to accept a second resistively coupled DC calibration signal, a second input port configured to accept a second oscillator signal that is approximately ninety degrees out of phase with the first oscillator signal, and an output port having a positive terminal coupled to the negative terminal of the output port of the first commutating mixer switch and a negative terminal coupled to the positive terminal of the output port of the first commutating mixer to provide a combined differential output signal.

23. The image-reject mixer of claim 22, further comprising:
a differential amplifier having a differential input including a non-inverting input terminal coupled to the negative terminal of the output port of the first commutating mixer, an inverting input terminal coupled to the positive terminal of the output port of the first commutating mixer, and a differential output.

24. The image reject mixer of claim 23 wherein the first and second DC calibration signals are selected to compensate for DC offset voltages present at the differential input of the differential amplifier.

25. An image-reject mixer comprising:
a first commutating mixer switch having a first input port including a first terminal, a second input port for accepting a first local oscillator signal, and an output port;
a first resistor coupled to the first terminal of the first commutating mixer switch, the first resistor further coupled to receive a first input signal;
a second resistor coupled to the first terminal of the first commutating mixer switch, the second resistor further coupled to receive a first DC calibration signal;
a second commutating mixer switch having a first input port including a first terminal, a second input port for accepting a second local oscillator signal phase shifted from the first local oscillator signal by approximately 90 degrees, and an output port;
a third resistor coupled to the first terminal of the second commutating mixer switch, the third resistor further coupled to receive a second input signal;
a fourth resistor coupled to the first terminal of the second commutating mixer switch, the fourth resistor further coupled to receive a second DC calibration signal;
wherein the first input signal is approximately ninety degrees out of phase with the second input signal, and the output port of the first commutating mixer switch is coupled to the output port of the second commutating mixer switch.

26. The image-reject mixer of claim 25 wherein the first input port of the first commutating mixer further comprises a second terminal and the first input port of the second commutating mixer further comprises a second terminal, and the image reject mixer further comprises:
a fifth resistor coupled to the second terminal of the first commutating mixer switch, the first and fifth resistors further coupled to receive the first input signal;
a sixth resistor coupled to the second terminal of the first commutating mixer switch, the second and sixth resistors further coupled to receive the first DC calibration signal;
a seventh resistor coupled to the second terminal of the second commutating mixer switch, the third and seventh resistors further coupled to receive the second input signal; and
an eighth resistor coupled to the second terminal of the second commutating mixer switch, the fourth and eighth resistors further coupled to receive the second DC calibration signal.

27. The image-reject mixer of claim 25, wherein the output port of the first commutating mixer switch comprises a positive terminal and a negative terminal and the output port of the second commutating mixer switch has a positive terminal coupled to the negative terminal of the first commutating mixer switch and a negative terminal coupled to the positive terminal of the first commutating mixer switch.

28. The image-reject mixer of claim 25, wherein the output port of the first commutating mixer switch comprises a positive terminal and a negative terminal and the output port of the second commutating mixer switch has a positive terminal coupled to the positive terminal of the first commutating mixer switch and a negative terminal coupled to the negative terminal of the first commutating mixer switch.

29. The image-reject mixer of claim 25, further comprising:
a differential amplifier having a input coupled to the output ports of the first and second commutating mixer switches, and an output.

30. The image reject mixer of claim 29 wherein the first and second DC calibration signals are selected to compensate for DC offset voltages present at the input of the differential amplifier.

* * * * *